(12) United States Patent
Kishimoto

(10) Patent No.: US 11,038,154 B2
(45) Date of Patent: Jun. 15, 2021

(54) VAPOR-DEPOSITION MASK, VAPOR-DEPOSITION METHOD AND METHOD FOR MANUFACTURING ORGANIC EL DISPLAY APPARATUS

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 36 days.

(21) Appl. No.: 16/342,945

(22) PCT Filed: Dec. 25, 2017

(86) PCT No.: PCT/JP2017/046410
§ 371 (c)(1),
(2) Date: Jul. 29, 2019

(87) PCT Pub. No.: WO2019/130387
PCT Pub. Date: Jul. 4, 2019

(65) Prior Publication Data
US 2021/0028408 A1    Jan. 28, 2021

(51) Int. Cl.
*H01L 51/56*     (2006.01)
*H01L 51/00*     (2006.01)
*G09F 9/00*      (2006.01)
*G09F 9/30*      (2006.01)
*C23C 14/04*     (2006.01)
*H01L 51/50*     (2006.01)

(52) U.S. Cl.
CPC .......... *H01L 51/56* (2013.01); *C23C 14/042* (2013.01); *H01L 51/0011* (2013.01); *H01L 51/5012* (2013.01)

(58) Field of Classification Search
CPC ..... H01L 51/56; H01L 51/0011; H01L 51/50; H01L 51/001; H01L 51/5012; H01L 27/32; C23C 14/042; C23C 14/24; C23C 14/228; C23C 16/042; H05B 33/10; G09F 9/00
See application file for complete search history.

(56) References Cited

U.S. PATENT DOCUMENTS

2018/0175296 A1\* 6/2018 Kobayashi ............ C23C 14/228
2019/0067580 A1\* 2/2019 Nishida .................. C23C 14/24

FOREIGN PATENT DOCUMENTS

| JP | H07-23536 U  | 5/1995  |
| JP | 2006-322015 A | 11/2006 |
| JP | 2010-524241 A | 7/2010  |
| JP | 2010-247447 A | 11/2010 |
| JP | 2011-516736 A | 5/2011  |
| JP | 2014-205870 A | 10/2014 |

(Continued)

Primary Examiner — Caridad Everhart
(74) Attorney, Agent, or Firm — ScienBiziP, P.C.

(57) ABSTRACT

To obtain a vapor-deposition mask that suppresses heat conduction at a frame of the vapor-deposition mask and make the weight thereof lighter to achieve upsizing of the vapor-deposition mask and carry out high-definition vapor-deposition cheaply, the frame (15) to which a mask main body (10) is bonded is formed as a sandwich structure (150) in which end plate (152) is bonded onto an opposing surface of at least a part of a core portion (151) in the vapor-deposition mask disclosed in the present embodiment.

10 Claims, 9 Drawing Sheets

(56) References Cited

FOREIGN PATENT DOCUMENTS

| JP | 2017-014582 A | 1/2017 |
|---|---|---|
| WO | 2008/124421 A1 | 10/2008 |
| WO | 2009/127272 A1 | 10/2009 |

\* cited by examiner

VAPOR-DEPOSITION MASK, VAPOR-DEPOSITION METHOD AND METHOD FOR MANUFACTURING ORGANIC EL DISPLAY APPARATUS

TECHNICAL FIELD

The present invention relates to a vapor-deposition mask, a vapor-deposition method, and a method for manufacturing organic-EL display apparatus that vapor deposits an organic layer of an organic-EL display apparatus, for example.

BACKGROUND ART

When an organic-EL display apparatus is manufactured, a driving element such as a TFT is formed on a substrate, on which electrode organic layers are deposited in correspondence for each pixel.

This organic layer is susceptible to moisture, so that it cannot be subjected to etching. Therefore, as shown in FIG. 8, for example, deposition of an organic layer 80 is carried out by overlapping a vapor-deposition mask 82 comprising a mask main body 821 and a frame 822 and a substrate to be vapor-deposited 81 and vapor-depositing an organic material 85a of a vapor-deposition source 85 through an aperture 821c of the vapor-deposition mask 82. Then, the organic layer 80 that is necessary is deposited only on an electrode 81a surrounded by an insulating film 81b for a pixel necessary. This substrate to be vapor-deposited 81 and the vapor-deposition mask 82 are to be as proximate as possible for the organic layer 80 to be formed only at an accurate pixel region. A display image tends to be blurred unless the organic material is deposited only at the accurate pixel region. Thus, a magnetic chuck method is used in which a metal supporting layer 821b being a magnetic body is used for the vapor-deposition mask 82, and the substrate to be vapor-deposited 81 is interposed between the vapor-deposition mask 82 and an electromagnet or a permanent magnet 83 which is arranged such that it is fixed with a resin 84 on a surface opposite the substrate to be vapor-deposited 81 to place the substrate to be vapor-deposited 81 and the vapor-deposition mask 82 as proximate as possible (see Patent Document 1, for example).

While a metal mask is used conventionally as the vapor-deposition mask, consideration for using a resin film 821a and a hybrid-type mask main body 821 in which a portion except for a peripheral edge of the aperture 821c of the resin film 821a is supported by a metal support layer 821b has started. This vapor-deposition mask 82 is formed by fixing it to a frame 822 at a peripheral edge of the mask main body 821 to stabilize the mask main body 821 and to make handling of the mask main body 821 convenient. In FIG. 8, reference numeral 821d is an aperture at the metal support layer 821b that is formed to be larger than the aperture 821c so as not to close the aperture 821c of the resin film 821a. A peripheral edge of the metal support layer 821b is fixed, with welding, to a frame 822 formed with a metal such as invar, which has a low thermal expansion coefficient.

PRIOR ART DOCUMENT

Patent Document

Patent Document 1: JP 2014-205870 A

SUMMARY OF THE INVENTION

Problem to be Solved by the Invention

As described previously, with respect to the vapor-deposition mask 82, the peripheral edge of the mask main body 821 is joined to the frame 822. However, as evident from FIG. 8, at the time of vapor deposition, the frame 822 is most proximate to the vapor-deposition source 85. Therefore, the temperature of the frame 822 is most likely to rise, heat of the frame 822 heated is transmitted to the substrate to be vapor-deposited 81 and the mask main body 821 of the vapor-deposition mask 82, and the temperature of the substrate to be vapor-deposited 81 is also likely to rise. As the frame 822 is solid and weighty, causing the thermal capacity to increase, it is likely to hold the temperature once risen. As a result, the substrate to be vapor-deposited 81 is likely to rise in temperature at the peripheral edge more than at the center thereof. In other words, there is a problem that the difference in thermal expansion of the substrate to be vapor-deposited 81 is produced, making it not possible to form a uniform organic layer 80.

More specifically, this temperature distribution problem becomes conspicuous as the substrate to be vapor-deposited and the vapor-deposition mask are capsized. However, capsizing is further demanded for the vapor-deposition mask also with respect to cutting down cost by mass production. In other words, while the maximum size of the substrate to be vapor-deposited (the so-called size of a mother glass) in the process for manufacturing an organic-EL display apparatus at the present is G6H (half the size of the 6th generation (approximately 1500 mm×1800 mm), or, in other words, approximately 1500 mm×900 mm), the size of the mother glass to be used in the preceding manufacturing process of the liquid-crystal panel is over G10 (approximately 2880 mm×3130 mm), so that there is a strong demand for achieving further upsizing even with the organic-EL display apparatus. However, in the process for manufacturing an organic-EL display apparatus, it is considered difficult to make the substrate size larger than G6H. One of the factors is a problem of weight of the vapor-deposition mask.

With respect to the weight, the weight of the frame reaches approximately 80 kg even with the size of G6H as described above, which, with this weight, is close to the limit for a robot arm to convey the vapor-deposition mask, so that further increasing the weight is not possible. However, from the point of view of preventing misalignment between the substrate to be vapor-deposited and the vapor-deposition mask due to thermal expansion at the time of vapor deposition, taking into account that the material of the frame of the vapor-deposition mask is a material whose linear expansion coefficient is small and that tension is applied to the mask main body to perform joining, there is a constraint that the frame cannot be made slimmer or thinner compared to that at the present. Thus, it is also not possible to effortlessly change the material of the present frame to a lighter material.

The present invention is made to solve such problems. An object of the present invention is to provide a vapor-deposition mask and a vapor-deposition method using the above-mentioned vapor-deposition mask that make it possible to suppress heat conduction in the frame of the vapor-deposition mask and to reduce the weight of the vapor-deposition mask to achieve upsizing and carry out high-definition vapor-deposition cheaply.

Another object of the present invention is to provide a method of manufacturing a large-sized organic-EL display apparatus having excellent display definition using the above-described vapor-deposition method.

Means to Solve the Problem

A vapor-deposition mask according to a first embodiment of the present invention comprises: a mask main body at which an aperture pattern is formed; and a frame to which at least a portion of a peripheral edge of the mask main body is joined to hold the mask main body at a certain state, wherein the frame is formed as a sandwich structure in which an end plate is bonded onto an opposing surface of at least a part of a columnar-shaped core portion enclosing a gap.

A method of vapor deposition according to a second embodiment of the present invention comprises: arranging a substrate to be vapor-deposited and the vapor-deposition mask such that they overlap each other; and, by causing a vapor-deposited material to fly away from a vapor-deposition source arranged at a distance from the vapor-deposition mask, depositing the vapor-deposited material onto the substrate to be vapor-deposited.

A method for manufacturing an organic-EL display apparatus according to a third embodiment of the present invention comprises: forming at least a TFT and a first electrode on a supporting substrate; vapor-depositing an organic material on the supporting substrate using the method of vapor deposition to form an organic deposition layer; and forming a second electrode on the organic deposition layer.

Effects of the Invention

According to the present invention, without changing a frame material of a vapor-deposition mask, constituting materials thereof are reduced, so that, without changing the physical property such as a linear expansion coefficient, a gap is formed within the material to reduce the weight thereof. By forming this gap in a honeycomb structure, for example, stress per unit mass improves several times that of a solid material, and the weight can be substantially reduced while almost not affecting at all with respect to stretching of the mask main body. Moreover, having the gap formed causes heat conduction to be suppressed substantially and conduction of heat due to radiation from a vapor-deposition source at the time of vapor-deposition to be suppressed substantially. Furthermore, a weight reduction also causes a thermal capacity reduction, making it possible to suppress heat accumulation even when vapor deposition is carried out continuously while replacing a substrate to be vapor-deposited.

EMBODIMENT FOR CARRYING OUT THE INVENTION

Figure 1A:
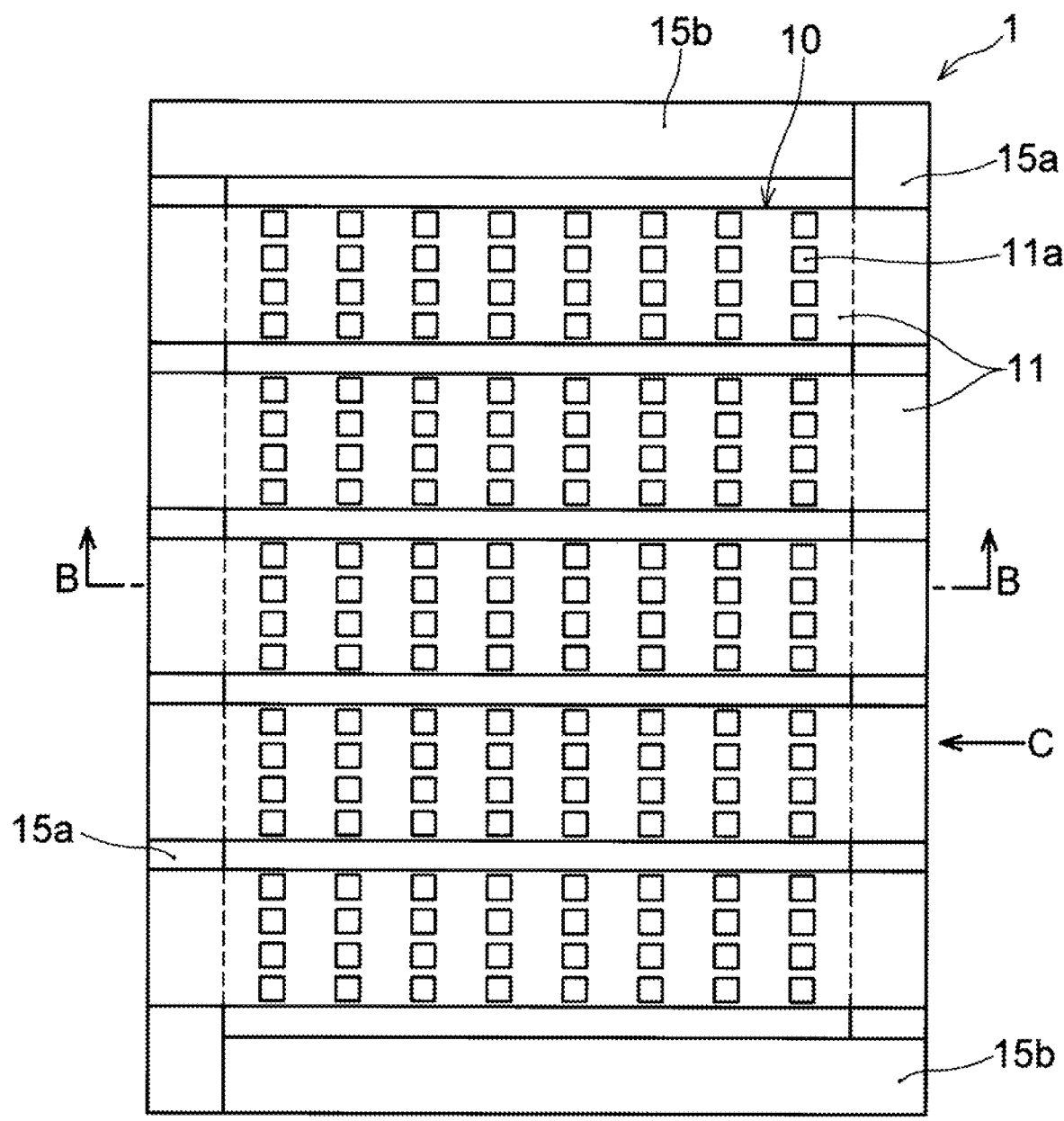
FIG. 1A shows a schematic upper surface of a vapor-deposition mask according to one embodiment of the present invention.
Figure 1B:
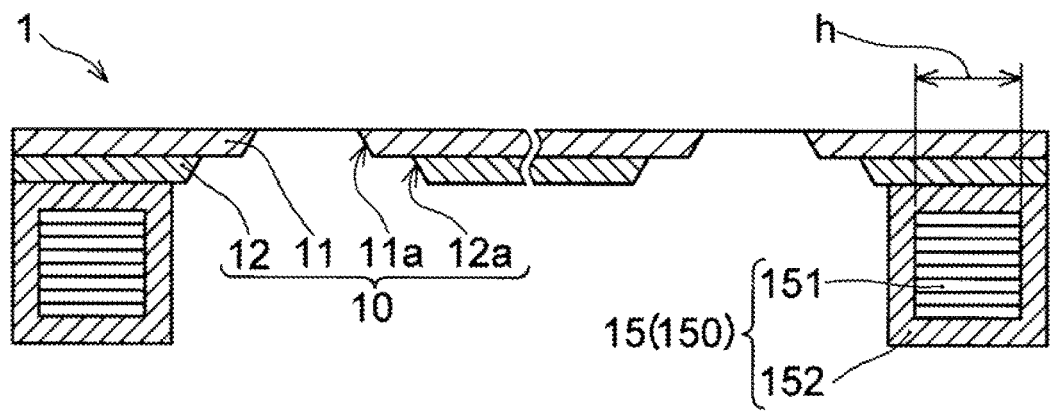
FIG. 1B shows a cross-sectional view taken along a line B-B in FIG. 1A.
Figure 1C:
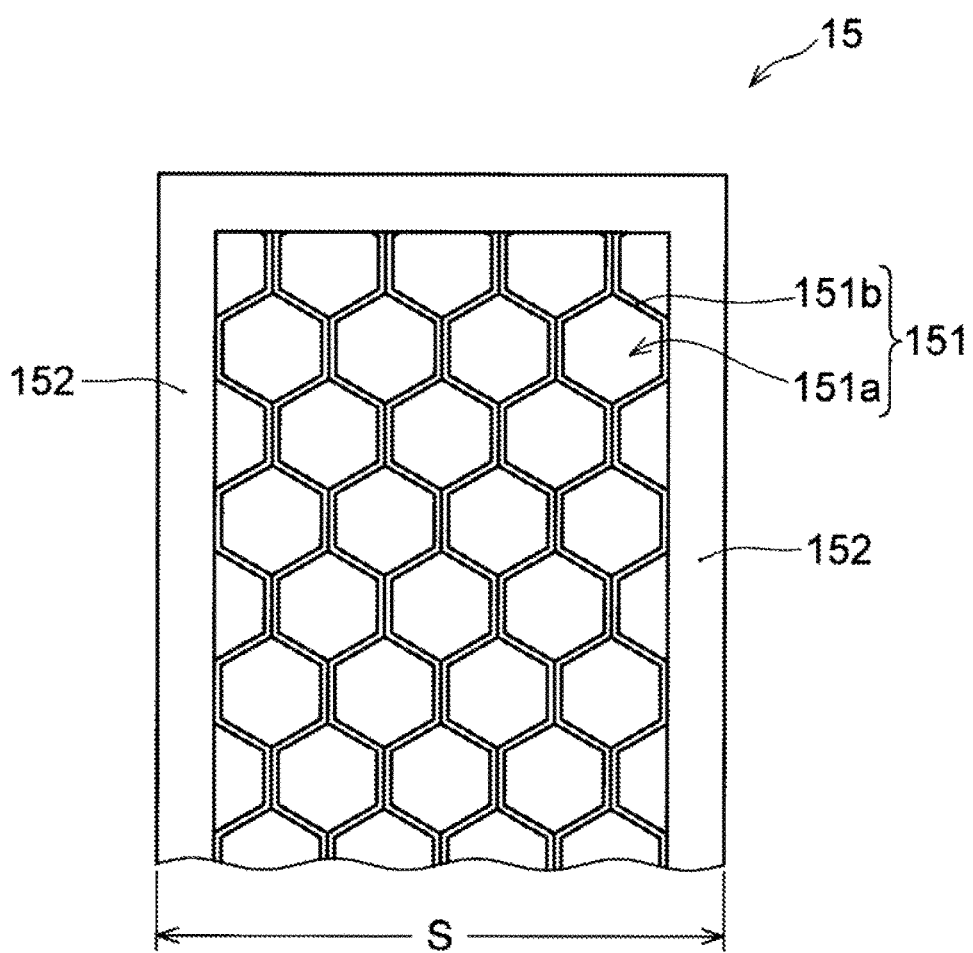
FIG. 1C shows a view as seen from an arrow C in FIG. 1A.

Next, a vapor-deposition mask according to a first embodiment and a vapor-deposition method according to a second embodiment of the present invention are described with reference to the drawings. With a plan view of a vapor-deposition mask 1, cross-sectional view taken along a line B-B, and a view as seen from an arrow C respectively shown in FIGS. 1A to 1C, the vapor-deposition mask 1 according to the present embodiment comprises a mask main body 10 at which an aperture pattern 11a is formed and a frame 15 to which at least a portion of a peripheral edge of the mask main body 10 is joined to hold the mask main body 10 at a certain state. Then, as shown in FIG. 1C with a plan view in which is seen a columnar-shaped core portion 151 which has a gap 151a, removing a part of an end plate 152, the frame 15 is formed in a sandwich structure 150 in which the end plate 152 is bonded onto a surface opposing at least a part of the core portion 151. The mask main body 10 shown in FIG. 1A is a hybrid mask in which a metal supporting layer 12 comprising an aperture 12a formed so as to not close an aperture pattern 11a of a resin film 11 is bonded to the resin film 11 on which the aperture pattern 11a is formed. However, it is construed to be not limited to such a configuration, so that the mask main body 10 is also applicable to a metal mask comprising only a thin metal plate or only the resin film 11. For a hybrid mask, the metal supporting layer 12 is joined to the frame 15 as well as the resin film 11.

As described previously, with the conventional vapor-deposition mask, there is a problem that the temperature of the substrate to be vapor-deposited 2 and the vapor-deposition mask 1 at the periphery of the frame 15 (see FIG. 2) tends to rise and that there is a limit to upsizing since the weight of the vapor-deposition mask 1 dramatically increases with upsizing. In other words, as described later, at the time of vapor deposition, the vapor-deposited material is caused to fly away from the vapor-deposition source 5 (see FIG. 2) to the vapor-deposition mask 1. Therefore, the vapor-deposition source 5 is very high in temperature and a portion of the frame 15 that is closest to the vapor-deposition source 5 also rises in temperature due to radiative heat. In the vapor-deposition mask 1, the temperature of a portion of the metal supporting layer 12 also rises, which heat thereof is transmitted to the substrate to be vapor-deposited 2. However, as described previously, the temperature increase in the portion of the frame 15 is larger than the temperature increase in the metal supporting layer 12 of the center portion and the thermal capacity of the frame 15 is large because it has substantial weight. Moreover, while invar, which has a small linear expansion coefficient, has a relatively small thermal conductivity in metals, the thermal conductivity is approximately 10 times that of acrylic or glass. Therefore, it is considered that heat conduction to the substrate to be vapor-deposited 2 by the frame 15 is more substantial than heat transmitted from the center portion of the metal supporting layer 12 to the substrate to be vapor-deposited 2. Moreover, the conventional frame is formed with a solid rod material, so that, once the temperature rises, high temperature is maintained for a long time since the thermal capacity is large. Therefore, when the substrate to be vapor-deposited 2 is replaced and vapor deposition onto another substrate to be vapor-deposited 2 is carried out on completion of vapor deposition onto the substrate to be vapor-deposited 2, the temperature of the frame 15 is high from the outset thereof, so that the substrate to be vapor-deposited 2 in the vicinity thereof is likely to raise in temperature from the time it is installed. Therefore, there is a problem that the substrate to be vapor-deposited 2 has a large thermal expansion at the peripheral edge thereof and is likely to produce misalignment with a center portion.

Moreover, with upsizing of the vapor-deposition mask, the weight of the frame 15 of the structure shown in FIG. 1A also becomes problematic. In other words, while the mask main body 10 comprising the resin film 11 and the metal supporting layer 12 are joined to the frame 15 as described previously, the mask main body 10 is bonded to the frame 15 with tension applied from the viewpoint of the stability of the shape of the aperture. This tension is, for example, approximately 10N for each sheet of the strip-shaped resin film 11 shown in FIG. 1 and approximately several ten millimeters are needed for each of the width and the thickness of the frame 15. When the vapor-deposition mask 1 of the size of G6H described previously is formed with a rectangular rod material of 50 mm×40 mm, for example, the size of G6H is the size of the substrate and the frame 15 is arranged at the outer periphery thereof, so that the length of each side of the frame 15 is 50 mm larger than the size of G6H. While the frame 15 is rectangular-frame shaped, so that the length of only two long sides of a vertical frame 15a can be made to be long to make the short side of a horizontal frame 15b to be the dimension of the substrate size, for example, in which case the long side of the vertical frame 15a needs to be made twice as long as the frame width (approximately 100 mm), the result is the same as extending each side by 50 mm.

Thus, the total volume of the frame 15 is 2×(1550 mm+950 mm)×2000 mm² =10000 cm³. As described previously, the linear expansion coefficient of the material of this frame 15 is preferably close to that of the substrate to be vapor-deposited 2 (see FIG. 2) and glass, or polyimide, whose linear expansion coefficient is close to that of glass, is used as the substrate to be vapor-deposited 2, invar is generally used for the frame 15 or the metal supporting layer 12 of the vapor-deposition mask 1. The relative density of invar is approximately 8, so that the weight thereof is approximately 80 kg. It is aimed that the frame 15 be further capsized relative to G6H, so that it is necessary to make each side of the frame 15 longer, but also to make the width and the thickness of the frame 15 greater, so that the weight thereof becomes greater than the above-mentioned weight. As a result, conveyance thereof by a robot arm becomes impossible.

To solve these problems, the present inventor has made intensive studies. However, unless the linear expansion coefficient of the vapor-deposition mask 1 and that of the substrate to be vapor-deposited 2 are as close to each other as possible, misalignment between the vapor-deposition mask 1 and the substrate to be vapor-deposited 2 is likely to occur due to thermal expansion at the time of vapor-deposition. Therefore, the linear expansion coefficient of the material needs to be taken into account, so that it is not possible to simply change the material to a lighter one. Moreover, for the same reason, it is difficult to select a material whose thermal conductivity is small.

Thus, as a result of having made intensive studies, the present inventor has found that a substantial weight reduction can be made while maintaining the linear expansion coefficient and the mechanical strength by reducing the amount of usage of the material of the frame 15, or, in other words, making the frame 15 to be a sandwich structure having a gap, even though the same material as that used conventionally is used. The inventor has found that no problem occurs even when tension is applied to the mask main body 10 to join the mask main body 10 to the frame 15 without impairing the mechanical strength by making the gap as a honeycomb structure in particular.

(Structure of Vapor-deposition Mask)

Figure 5:
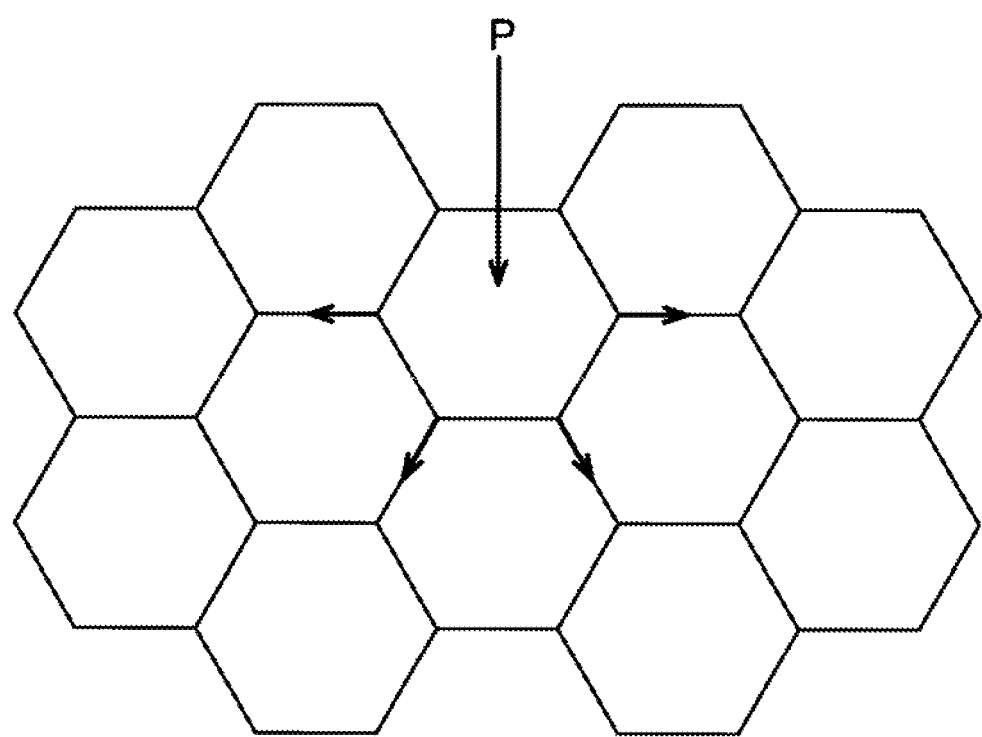
FIG. 5 shows a diagram explaining a reason that a honeycomb structure is strong even against a force in the horizontal direction.

More specifically, as shown in FIG. 1C with a side view as seen from an arrow C in FIG. 1A, the frame 15 has a through hole gap) 151a formed and the through hole 151a is formed to have a hexagonal shape. The through hole 151a is formed in such a hexagonal honeycomb structure, so that it is very strong against not only stress in an axial direction of the through hole 151a, but also against stress in a direction perpendicular to the aperture of the through hole 151a. The reason is that, as shown in a schematic diagram of the honeycomb structure in FIG. 5, for example, when a stress P in the horizontal direction is applied against the through hole 151a, stress is uniformly shared to each side of the hexagonal. Thus, the through hole 151a is very strong even with respect to the stress P in the horizontal direction and a strength per unit mass is 4 to 6 times the strength of a solid material. Conversely, the weight thereof can be reduced to approximately ⅙ to ¼ to maintain the same stress. Moreover, the material is the same, so that physical constants such as the linear expansion coefficient and the thermal conductivity do not change. Furthermore, the presence of the gap (through hole 151a) makes the heat conduction to be reduced to approximately ⅙ to ¼ and also make the volume of the part of the thin-walled portion 151b to be reduced, also causing the thermal capacity to be reduced. At the time of sticking the end plate 152 as described later, the interior of the through hole 151a can be depressurized, or the through hole 151a can be sealed in with a rare gas such as argon to further reduce heat conduction.

While the present example is explained using an example of a narrowly-defined honeycomb structure that is regular hexagonal shaped, it is construed that the shape of the gap 151a be not necessarily limited to a regular hexagon, so that, while being somewhat weaker against horizontal stress, it can be an irregular hexagon, a polygon other than a hexagon, or, in extreme cases, a circle. In case of the shape of the gap 151a being circular, a circular hole with a small radius can be made to be inscribed in a region surrounded by four circles to form a thin-walled portion 151b that is thin-walled and has similarly many gaps 151a. In the present specification, a broadly-defined honeycomb structure including these structures is called a honeycomb structure. Moreover, it is construed that the present embodiment be not limited to such a honeycomb structure, so that, even with a corrugated structure shown in FIGS. 3A to 3B, the orientation thereof is set such that an axial direction of the through hole (the gap) 161a is oriented to the direction in which stress is applied to cause a frame 15 that is similarly lightweight and large in mechanical strength to be formed.

Figure 3A:
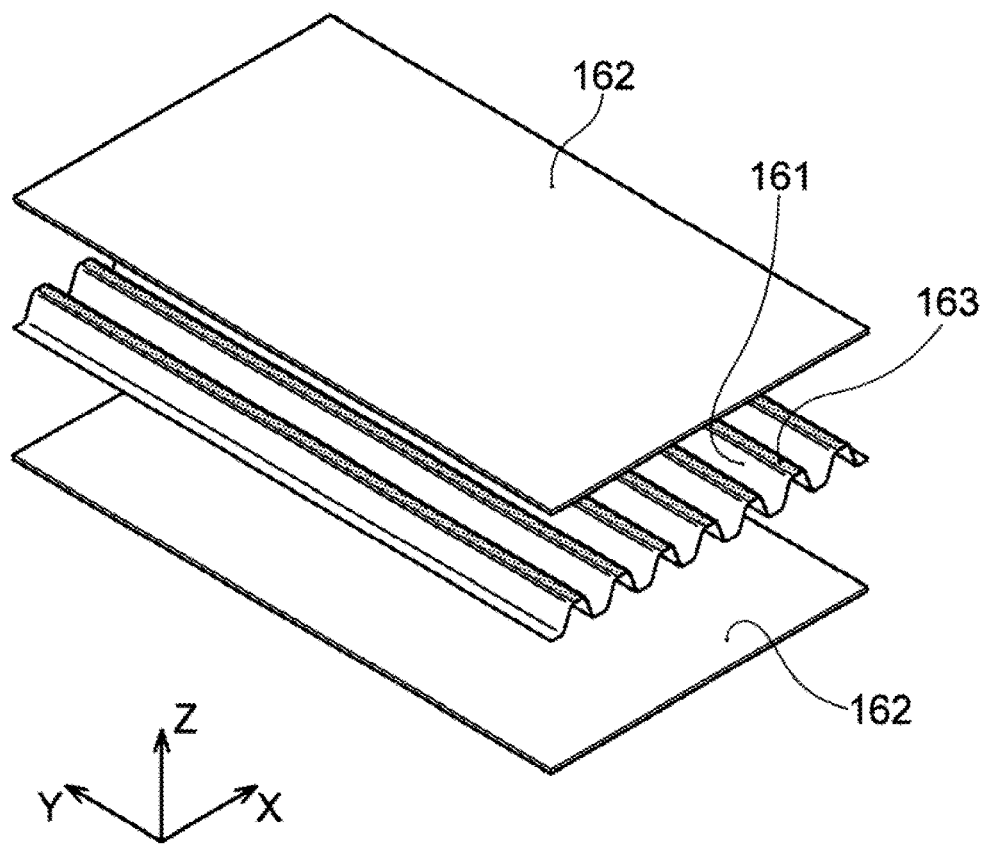
FIG. 3A shows another exemplary structure of a frame in FIG. 1A.
Figure 3B:
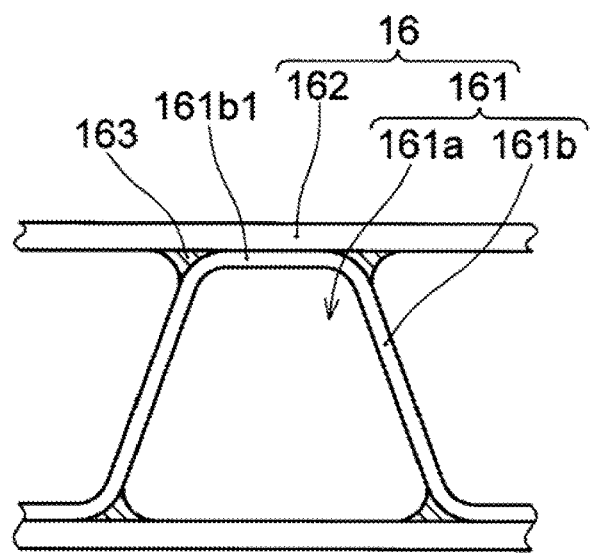
FIG. 3B shows an enlarged view of a connection portion between a core and an end plate in FIG. 3A.

In the structure shown in FIG. 3A, a plate-shaped body is bent into a wave shape to form a wave plate 161b to make the wave plate 161b and the gap 161a as the core portion 161, and an end plate 162 is bonded onto the outside of peak portions and valley portions of the wave plate 161b to form a sandwich structure 16. While this structure is somewhat weak with respect to a force in the left-right horizontal direction (x-axis direction) in FIG. 3A, it is strong with respect to stress in the axial direction (y-axis direction) in FIG. 3A and also strong with respect to stress in the z-axis direction to some extent. In this case, as shown in FIG. 3B, the wave plate 161b and the end plate 162 are firmly adhered to cause a large mechanical strength to be obtained. Thus, preferably, peak portions and valley portions 161b1 of the waveform of the wave plate 161b are made somewhat planar to provide joining using an adhesive 163 or solder. While the end plate 162 is provided on only upper and lower surfaces in the example shown in FIG. 3A, it is preferable that the surrounding of side surfaces be covered with the end plate 162.

Figure 6A:
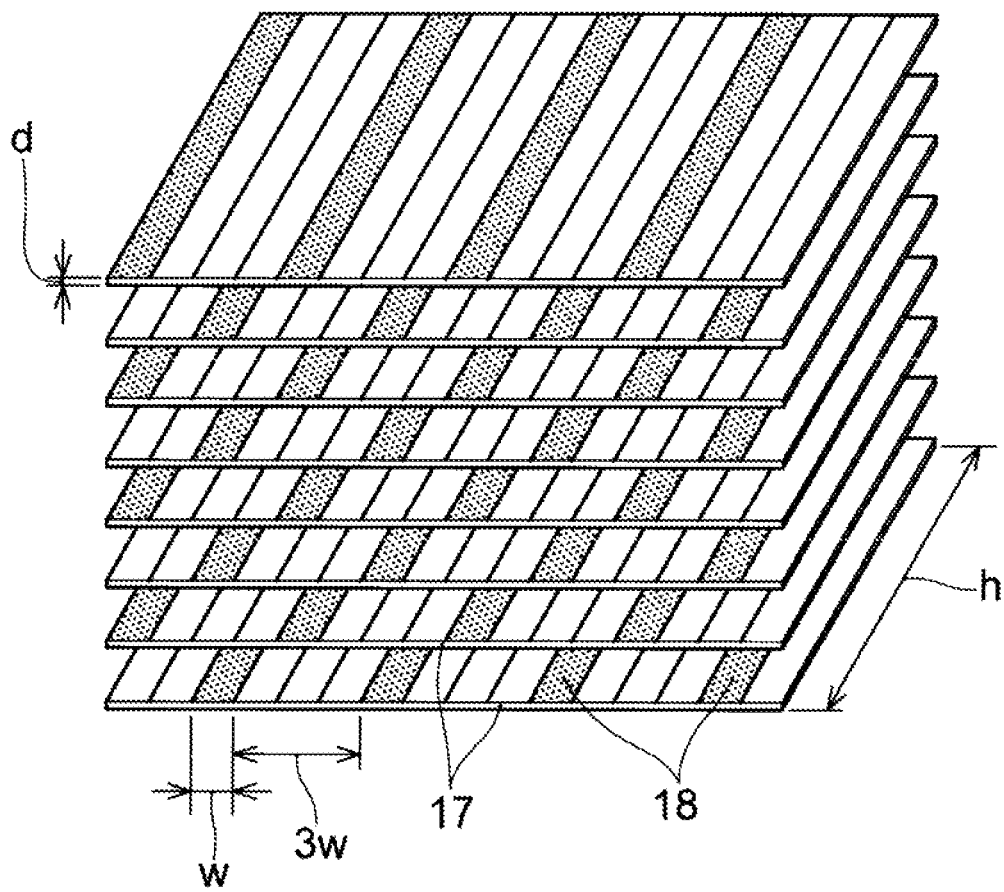
FIG. 6A shows an exemplary manufacturing process of manufacturing a honeycomb structure.
Figure 6B:
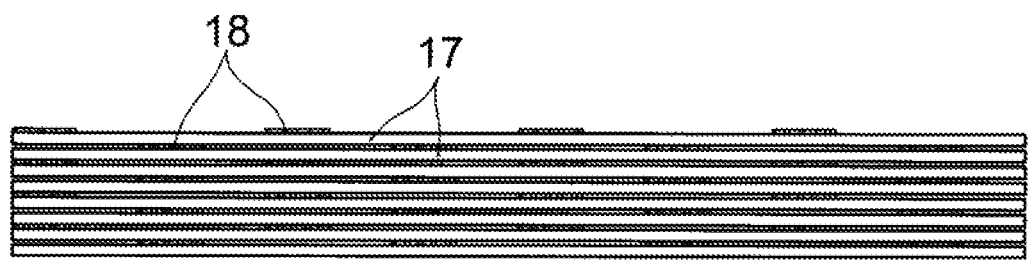
FIG. 6B shows an exemplary manufacturing process of manufacturing a honeycomb structure.

The core portion 151 of the sandwich structure 150 having the previously-described honeycomb structure can be formed from sheets of plate-shaped body 17, as shown in FIGS. 6A to 6D, for example. In other words, as shown in FIG. 6A, a first sheet having adhesive layers 18, each of which has a width w of approximately 2.5 mm to 5 mm is formed with an interval of 3w formed of invar plate (plate-shaped body 17) with a thickness d of approximately 0.5 mm and a width h (corresponding to a height h (see FIG. 1B) of the core portion 151 of the honeycomb structure for the frame 15 used in the structure shown in FIG. 1A) of approximately 20 mm to 50 mm and a second sheet having adhesive layers 18, each of which has a width w from the end position of one of adhesive layers 18 of the first sheet with an interval of 3w is formed on a plate-shaped body 17. Then, a third sheet having adhesive layers 18, each of which has a width w from the end position of one of adhesive layers 18 of the second sheet with an interval of 3w is similarly formed on a plate-shaped body 17. Similarly, a fourth sheet of plate-shaped body 17 having adhesive layers 18, each of which has a width w from the end position of one of adhesive layer 18 of the third sheet with an interval of 3w is similarly formed. On the fifth sheet of plate-shaped body 17, adhesive layers 18 are formed such that they are located at the same position as that on the first sheet of plate-shaped body 17. On the sixth sheet and thereafter of plate-shaped body 17, adhesive layers 18 are similarly formed. After a required number of sheets of plate-shaped body 17 are formed, the sheets of plated-shaped body 17 are overlapped and adhered to each other (see FIG. 6B). As an adhesive, a polyimide adhesive, for example, can be used. Alternatively, soldering using a silver solder can also be used.

Figure 6C:
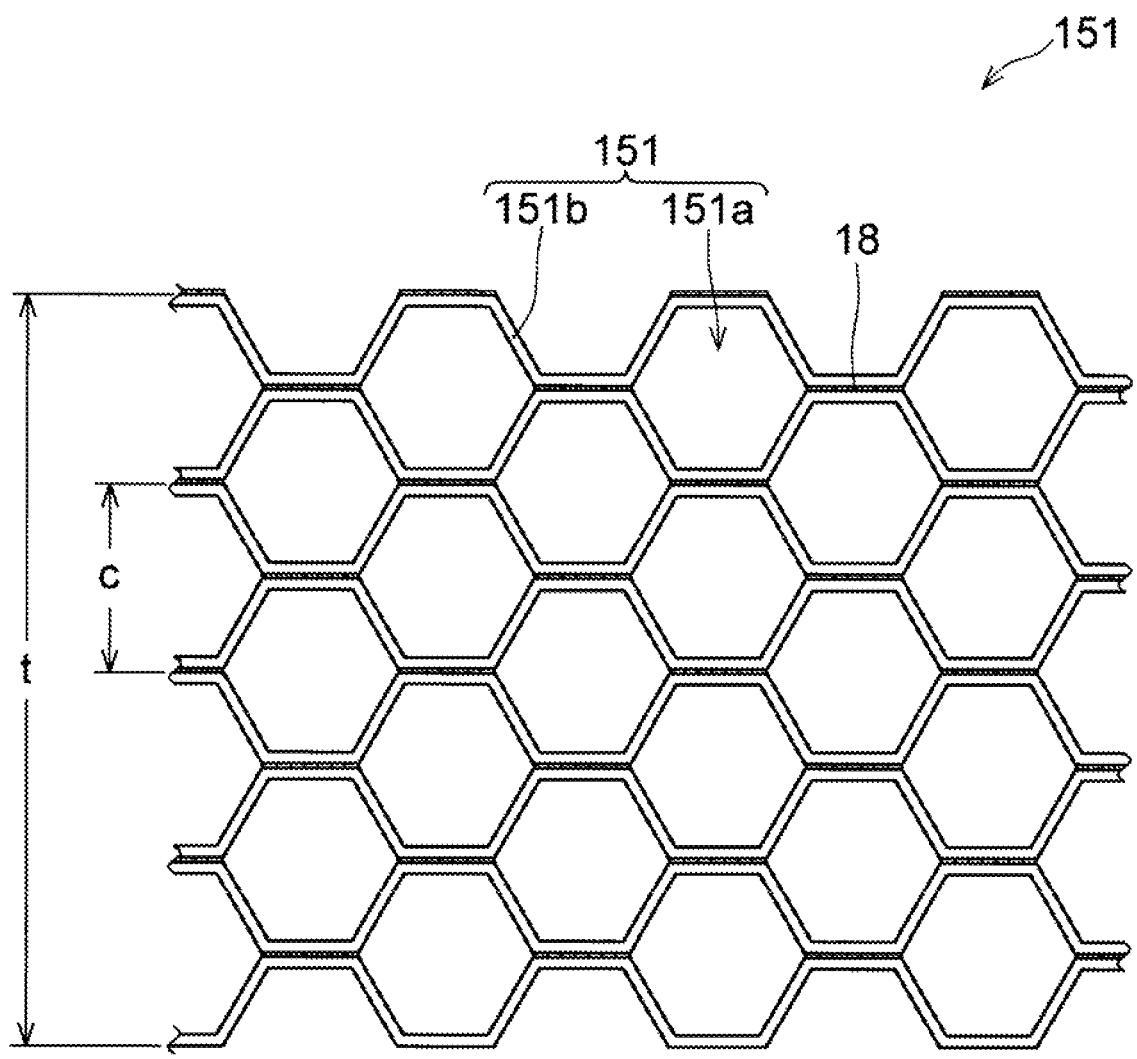
FIG. 6C shows an exemplary manufacturing process of manufacturing a honeycomb structure.
Figure 6D:
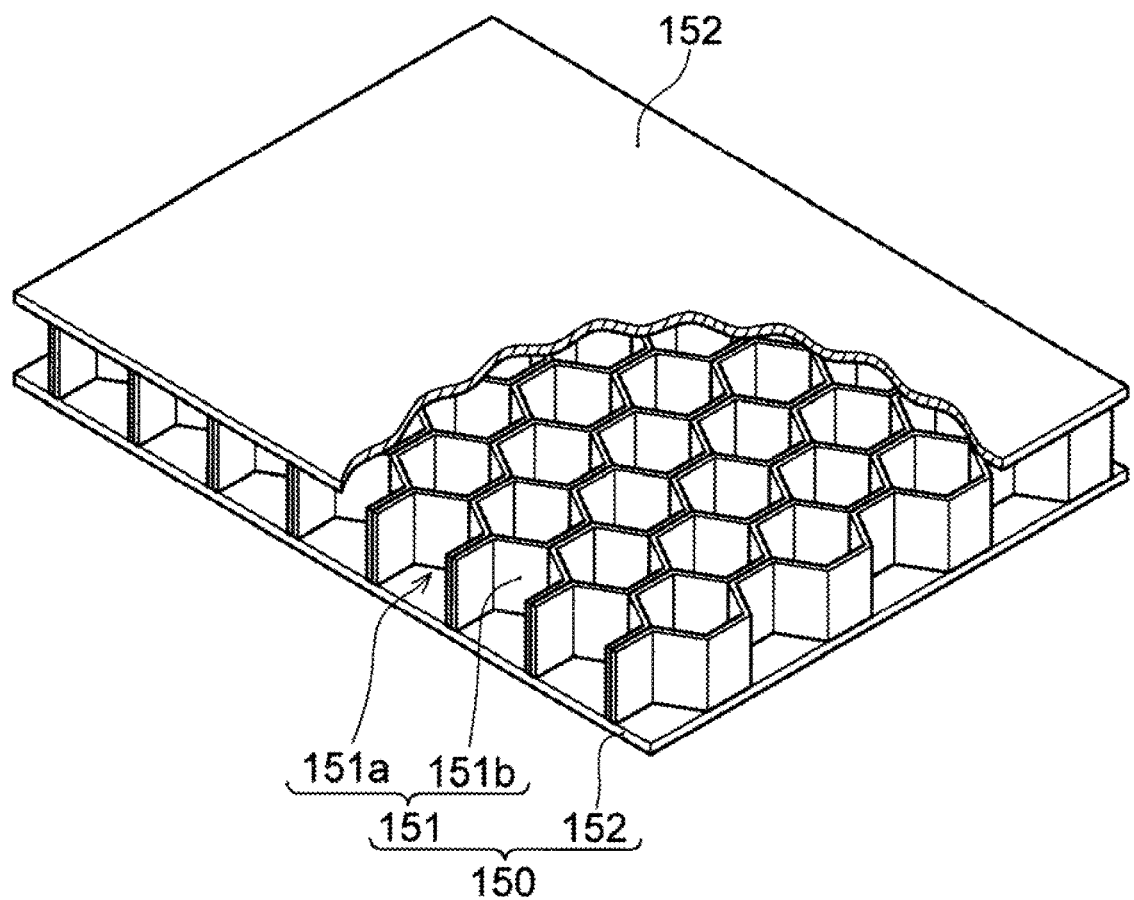
FIG. 6D shows a perspective diagram of a core portion in FIG. 6C.

Thereafter, as shown in FIG. 6C, holding and drawing out the lowermost and uppermost sheets of plate-shaped body 17 cause the surrounding portion of each part adhered with the adhesive layer 18 to be deformed to form an approximately 120° angle with the part adhered, forming the core portion 151 comprising the gap 151a and the thin-walled portion 151b with a wall thickness of 2d for the part adhered and a wall thickness of d for the other part. In this example, the cell size c is formed to be approximately 5 mm to 10 mm. A perspective diagram for this state is shown in FIG. 6D. A columnar-shaped body with a quadrilateral having a length (a width of the frame 15) s (see FIG. 1C) in which a width t of the core portion of FIG. 6C and twice a thickness of the end plate 152 described later are added and having the previously-described height of h as a cross section is formed. The width s and the height h are each formed to approximately several ten millimeters and the length is set in accordance with the size of the vapor-deposition mask 1. However, it is construed that the above be merely exemplary, so that these dimensions can be set arbitrarily in accordance with setting of the through hole 151a in which orientation of the frame 15.

It is construed that the thickness d of the plate-shaped body 17 used in the previous example be also not limited thereto, so that it can be selected to a thickness which can tolerate the necessary load.

For example, a plate thickness d can be increased to enable the plate-shaped body to resist a large load. In this case, if the plate material gets too thick, it becomes more difficult for the plate-shaped body to be deformed when the upper and lower surfaces of the plate-shaped body are drawn out and stretched, so that a groove which makes it easier for the plate-shaped body to be bent can be formed on a portion at which the plate-shaped body is to be bent. Moreover, it is not necessary to create this structure from the plate-shaped body 17, so that a through hole can be formed from a solid material to create the honeycomb structure. In this case, while it can be viewed as a waste of materials, shaven materials can be collected to reuse the collected materials. Therefore, the sandwich structure 150 comprising a gap with various structures can be formed.

The sandwich structure 150 comprising a honeycomb structure has the features that it is strong with respect to in-plane/out-of-plane shear load and out-of-plane compression load and that it has a high out-of-plane rigidity (a high buckling strength). Stress is made to apply in the maximum-strength direction, so that advantages (i.e., lightweight and highly rigid) of the honeycomb structure are utilized. Using the thickness d shown in FIG. 6A and the cell size shown in FIG. 6C, the higher the value of 2 d/c, the higher the rigidity, so that, then the rigidity is to be increased, the plate thickness d can be increased and the cell size c can be decreased to easily obtain a desired rigidity.

While the core portion 151 thus formed can be utilized as a highly-rigid material as it is, as shown in FIG. 1C, the periphery can be surrounded by the end plate 152 to make a sandwich structure 150 to further increase the rigidity. For the end plate 152, an invar plate having a thickness of approximately 3 mm is used, for example. In FIG. 1C, for ease of understanding of the internal structure, the end plate 152 that closes the gap (through hole) 151a is not shown. While the endplate 152 can be bonded for each surface of a quadrangular prism, it is made stronger with respect to rigidity in all directions by bending one or two plate materials such that they surround the four sides of the core portion 151. The use as a frame 15 of the vapor-deposition mask 1 is also preferable from a point of view of not only rigidity, but also from a point of view of suppression of an organic material penetrating into the gap 151a. In other words, this is because, at the time of vapor deposition, the organic material floats in a vacuum chamber and is also likely to seep into the gap 151a. Moreover, with respect to the vapor-deposition mask 1, when a certain number of vapor depositions are carried out, it is necessary to remove the organic material adhered to the vapor-deposition mask 1, so that the vapor-deposition mask 1 is cleaned periodically. At the time of this cleaning, the cleaning agent can also get into the gap 151*a* and can remain in the gap 151*a* even after cleaning. Vapor deposition is carried out with this vapor-deposition mask 1 being installed within the vacuum chamber, so that, if the cleaning agent remains in the gap at the time of making the chamber vacuum, the remained cleaning agent is caused to be a gas source, making it not possible to carry out normal vapor deposition.

Therefore, it is preferable that this gap 151*a* be sealed hermetically with the end plate 152. Irregularities are present not only on an aperture surface of the gap (through hole) 151*a*, but also on the side surface (a side surface which is parallel with the through hole 152), it is preferable for the same reason that the end plate 152 be bonded thereon. This end plate 152 can be formed using an adhesive or soldering when forming the core portion 151 of the previously-described honeycomb structure. While a firm connection can be made at a portion at which the end plate 153 can adhere onto a portion of a surface of the core portion 151 in the upper and lower surfaces shown in FIG. 6C, a contact area between the core portion 151 and the end plate 152 is small in the aperture surface of the gap 151*a* and left and right surfaces in FIG. 6C, so that sufficient adhesive or soldering is needed. However, as described previously, instead of the end plate 152 being separately bonded onto each side surface, one metal plate is bent and bonded, causing an increased strength against stress and also an increased strength of adhering onto the core portion 151. As a result, as described previously, it is preferable that all of six sides of the quadrangular prism be surrounded by the end plate 152.

The rod-shaped sandwich structure 150 thus formed is prepared in accordance with the length of a long-side vertical frame 15*a* and a short-side horizontal frame 15*b* of the vapor-deposition mask 1 and ends of the rod-shaped sandwich structure 150 are joined to manufacture the frame body of the frame 15. While this rod-shaped sandwich structure 150 is conventionally joined using a bolt, in the present embodiment, there are many gaps, so that sufficient fixing is required such that torsion does not occur. Therefore, it is preferable that assembling be carried out by having a splint applied to a corner portion of a frame-like quadrilateral, passed through the sandwich structure 150, and fastened with bolts and nuts. Joining of the corner portion is sufficiently carried out, making occurrence of torsion difficult.

While the gap 151*a* is preferably closed by the end plate 152 as described previously, it is more preferable that the interior of the gap 151*a* be brought to negative pressure (be depressurized) by bonding the end plate 152 under reduced pressure at the time of closing the gap 151*a*. This is because, as the vapor-deposition mask 1 is used in a vacuum evaporation apparatus as described previously, air trapped within the gap 151*a* in the vacuum chamber can leak in case the interior of the gap 151*a* is sealed at one atmospheric pressure, thus causing the degree of vacuum within the vacuum chamber to be reduced. Moreover, the interior of the gap 151*a* being brought to negative pressure also reduces heat conduction, and, moreover, heat conduction to the frame 15 heated by the vapor-deposition source 5 (see FIG. 2) can further be suppressed.

From the point of view of suppressing heat conduction, a rare gas such as argon can be sealed into the gap 151*a* to further suppress heat conduction. This is because the rare gas has a low thermal conductivity. To seal in the rare gas or depressurize within the gap 151*a* as such, the core portion 151 and the end plate 152 can be joined under the depressurized atmosphere and/or under the rare gas atmosphere.

In the example shown in FIG. 1A, with respect to the portion of the vertical frame 15*a* of the frame 15 that corresponds to the long side of the rectangular-shaped vapor-deposition mask 1, the core portion 151 is formed such that the gap (through hole) 151*a* faces outward from the center portion within the plane of the vapor-deposition mask 1. Thus, as shown in FIG. 1B with the cross-sectional view taken along the line B-B in FIG. 1A, the through hole (gap) 151*a* extends in the horizontal direction and, as shown in FIG. 1C with the view as seen from the arrow C in FIG. 1A (the view in which the end plate 152 is removed), the planar shape of the gap 151*a* appears as it is.

The sandwich structure 150 comprising such a gap 151*a* is particularly strong against load in the direction parallel to the axis of the gap 151*a*. On the other hand, as described previously, as the vapor-deposition mask 1 firmly stabilizes the aperture 11*a* of the resin film 11, the mask main body 10 (see FIG. 1B) comprising the resin film 11 and the metal supporting layer 12 is joined to the frame 15 such that it is pulled to apply tension (see FIG. 1B). There are various methods of bonding this mask main body 10 to the frame 15. While only five sheets of strip-shaped mask main body 10 are shown in the example shown in FIG. 1A, in actuality, in an example in which approximately 12 sheets are bonded successively, the mask main body 10 is pulled along the short-side horizontal frame 15*b* of the strip-shaped frame 15 and joined, by welding, to the long-side vertical frame 15*a*. Stress of approximately 10N per sheet is applied, so that stress of approximately 120N overall is applied. Thus, the long-side vertical frame 15*a* is formed such that the gap 151*a* faces toward the outside (left-right in FIG. 1A) from the center portion of the vapor-deposition mask 1 in the direction in which the above-mentioned tension is applied, or, in other words, in the direction in which the short-side horizontal frame 15*b* extends. In a case that there is no metal supporting layer 12, the resin film 11 can be directly adhered onto the frame 15 using an adhesive. In this case, an adhesive which does not produce gas at the time of vapor deposition is used. For example, as an adhesive, a completely curing adhesive such as a polyimide resin or a thermosetting epoxy resin is preferable.

Figure 4:
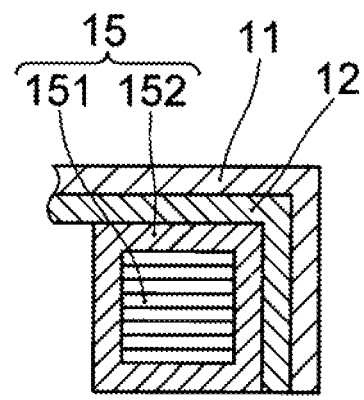
FIG. 4 shows another exemplary structure of joining of a mask main body and the frame.

When welding this strip-shaped mask main body 10 to the frame 15, having a long end portion of the mask main body 10 joined to the outer surface of the frame 15 that is opposite the center portion of the mask main body 10, or, in other words, an outer peripheral wall opposite to the inner surface of the frame 15, as shown in FIG. 4, further makes it strong against stress due to tension. In this case, welding is carried out from the right-side surface in FIG. 4. In particular, there is a great advantageous effect when bonding is carried out with an adhesive onto only the resin film 11 and there is no metal supporting layer 12.

With respect to the short-side horizontal frame 15*b* of the frame 15, substantial weight self-weight) of the vapor-deposition mask 1 is exerted onto the lower side when the vapor-deposition mask 1 is positioned upright (it can be not all the weight since the vapor-deposition mask 1 can be arranged in a slanting position, not being positioned vertically upright) in a case that this vapor-deposition mask 1 is arranged vertically (arranged such that the horizontal frame 15*b* shown in FIG. 1A is set to be upper and lower sides) to set the vapor-deposition mask 1 to be a vertical-type vapor-deposition apparatus, the short-side horizontal frame 15*b* is also formed such that the gap 151a faces externally within the plane from the center of the vapor-deposition mask 1. In this case, mutually pulling forces are applied to opposing two long-side vertical frames 15a, so that it is necessary that large load be tolerated also in the length direction of the short-side horizontal frame 15b. The length direction of the short-side horizontal frame 15b corresponds to the horizontal direction of the core portion 151, so that the strength against load in the length direction of the horizontal frame 15b can be less than the strength against load in axial direction of the gap 151a. However, as described above, the regular-hexagonal honeycomb structure can sufficiently tolerate a force which is evenly distributed to each side of the hexagon even for load from the horizontal direction. Moreover, the mask main body 10 of the vapor-deposition mask 1 can be bonded not in a strip shape, with a large quadrilateral mask being pulled in four directions, in which case, in the same manner as a case of the previously-described long-side vertical frame 15a, the orientation of the core portion 151 is preferably arranged such that the gap 151a faces the direction perpendicular to the side. Therefore, the orientation of the honeycomb structure of the long-side vertical frame 15a and the orientation of the honeycomb structure of the short-side vertical frame 15b are set to be different.

In other words, the vapor-deposition mask 1 features that the orientation of the gap 151a of the sandwich structure is different between the long-side vertical frame 15a and the short-side horizontal frame 15b. However, depending on the arrangement of the vapor-deposition mask 1, the orientation of the gap of each side of the vapor-deposition mask 1 can be adjusted as needed.

As shown with a cross-sectional view thereof in FIG. 1B, the mask main body 10 of the vapor-deposition mask 1 comprises the resin film 11, and the metal supporting layer 12, for which a magnetic material is used. As the metal supporting later 12, Fe, Co, Ni, Mn, or an alloy thereof, for example, can be used. Among them, invar (an alloy of Fe and Ni) is particularly preferable since the difference in the linear expansion rate relative to the substrate to be vapor-deposited 2 is small and there is almost no expansion due to heat. The thickness of the metal supporting layer 12 is formed to approximately 5 µm to 30 µm. However, the mask main body 10 is not construed to be limited to the hybrid mask comprising the resin film 11 and the metal supporting layer 12 as such, so that it can also be a resin mask comprising only a resin film or a metal mask comprising a thin metal plate (film).

Figure 2:
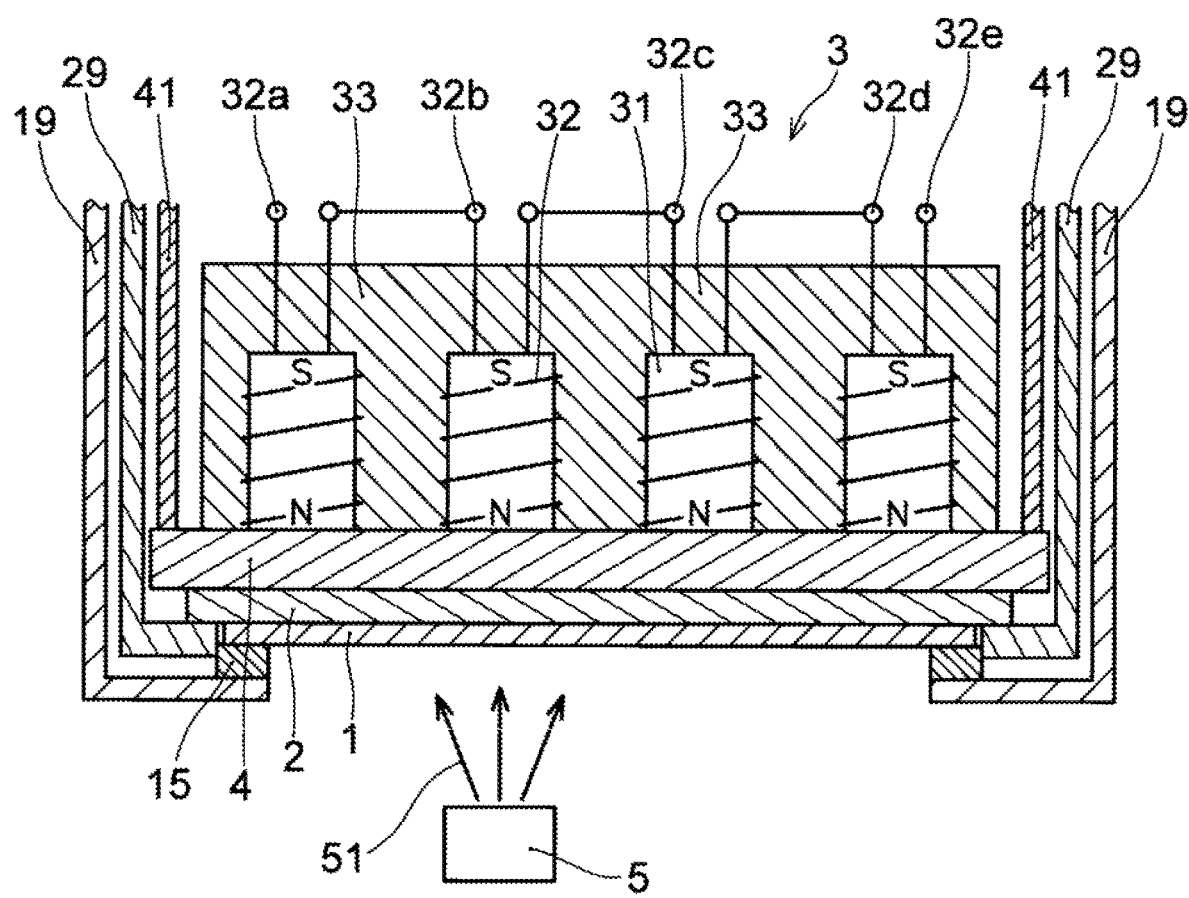
FIG. 2 shows a schematic side view of a vapor-deposition apparatus.

In FIG. 1B, the aperture 11a of the resin film 11 and the aperture 12a of the metal supporting layer 12 are formed in a tapered shape so as to be smaller toward the substrate to be vapor-deposited 2 (see FIG. 2). The reason is to prevent them, when the vapor-deposition material 51 (see FIG. 2) is vapor-deposited, from being shadows of the vapor-deposition material 51 flown away.

When the mask main body 10 is a metal mask, an aperture pattern is formed using an invar sheet whose thickness is approximately 30 µm, for example. Adjusting conditions of etching processing, the aperture pattern is formed in a tapered shape which becomes smaller toward the substrate to be vapor-deposited 2 in a manner similar to that of the resin mask. As shown in FIG. 1A, for example, such a mask main body 10 can be bonded in a plurality of sheets in a strip shape, or can be bonded as one sheet. This metal mask is also bonded onto the frame 15 by welding with tension being applied to the metal mask. While the metal mask can be curled, so that it is necessary to apply more tension to the metal mask than to the hybrid mask using the resin film, the frame 15 according to the present embodiment is very strong, so the advantageous effect is greater then the frame 15 according to the present embodiment is used for the metal mask than for the hybrid mask using the resin film 11.

Such a mask main body 10 can be bonded onto the previously-described frame 15 to obtain a vapor-deposition mask 1. While the above-described vapor-deposition mask 1 has a structure that the metal supporting layer 12 is attached onto the resin film 11, it can be without the metal supporting layer 12. In a case that there is no metal supporting layer 12, a further stability of the resin film 11 is required, so that the mask main body 10 needs to be fixed to a sturdy, strong frame 15. While the frame 15 is likely to be heavy as a result, the frame 15 can be made to be the sandwich structure 150 comprising the above-described gap 151a to prevent the weight from increasing. In a case that the metal supporting layer 12 is not provided, a magnetic body can be used for the frame 15 of the vapor-deposition mask 1 to allow adsorption with a magnet.

The frame 15 of the vapor-deposition mask 1 can be made to be a sandwich structure 150 comprising such a gap 151a to greatly reduce the weight. In other words, while the frame 15 is made to be a honeycomb structure having a structure shown in the previously-described FIG. 6D to reduce the weight of the vapor-deposition mask 1 of G4.5 to approximately ⅙ to ¼ of a conventional solid case, there is no problem with stress due to bonding of the mask main body 10. As a result, the vapor-deposition mask 1 having a weight approximately 3 to 4 times the above, or in other words, having a size of approximately G8 (approximately 2200 mm×2400 mm) can sufficiently be conveyed with a robot arm. Even when conveying the vapor-deposition mask 1 with the robot arm becomes possible, space is necessary with a horizontal-type vapor-deposition apparatus 1, and a very large space is necessary since, particularly in manufacturing an organic-EL display apparatus, 6 to 10 vacuum chambers are lined up to carry out vapor deposition while successively replacing the substrate to be vapor-deposited Therefore, it is preferable to use a vertical-type vapor-deposition apparatus (the vapor-deposition mask 1 and the substrate to be vapor-deposited 2 are positioned upright to cause the vapor-deposition material to be flown away from the horizontal direction) to reduce the ground area of factories.

Moreover, with the vapor-deposition mask according to the present embodiment, the frame 15 comprises a very large number of s 151a. Therefore, heat conductance is substantially suppressed. In other words, the vapor-deposition source 5 faces a surface of the frame 15 that is opposite to a surface on which the mask main body 10 is bonded, so that the temperature is likely to rise. However, a large number of gaps 151a formed can cause heat conduction to be suppressed substantially. Air or depressurized air or rare gas can further reduce heat conduction, making it possible to suppress a temperature increase of the substrate to be vapor-deposited 2. As a result, this makes an occurrence of the temperature distribution of the vapor-deposition mask 1 and the substrate to be vapor-deposited 2 unlikely. This makes it possible for a higher-definition organic layer pattern to be formed.

According to the vapor-deposition mask 1 of the present embodiment, a substantial reduction in the weight of the frame 15 causes the thermal capacity to be reduced. Therefore, while the temperature is likely to rise, it is conversely likely to fall. In other words, even when the substrate to be vapor-deposited 2 in a large number is successively vapor-deposited onto with an organic material, replacing the substrate to be vapor-deposited 2, heat accumulates in the vapor-deposition mask 1, so that an immediate heating upon the following substrate to be vapor-deposited 2 being arranged does not occur. As a result, a stable vapor deposition can be repeated.

(Schematic configuration of vapor-deposition apparatus)

As shown in FIG. 2, according to a vapor-deposition apparatus using a vapor-deposition mask 1 according to one embodiment of the present invention, a mask holder 19 and a substrate holder 29 are provided to be moveable upward or downward such that the vapor-deposition mask 1 and the substrate to be vapor-deposited 2 are arranged in proximity in the interior of a vacuum chamber. This substrate holder 29 holds a peripheral edge portion of the substrate to be vapor-deposited 2 with a plurality of hook-shaped arms and connected to a drive apparatus (not shown) such that it can rise upward or fall downward. For replacing the substrate to be vapor-deposited 2, the substrate to be vapor-deposited 2 carried into the vacuum chamber with the robot arm is received with a hook-shaped arm and the substrate holder 29 falls until the substrate to be vapor-deposited 2 comes very close to the vapor-deposition mask 1. Then, an imaging device (not shown) is also provided to carry out alignment. A touch plate 4 is supported by a support frame 41 and is connected via the support frame 41 to a drive apparatus which cause the touch plate 4 to fall until it comes into contact with the substrate to be vapor-deposited 2. The touch plate 4 being made to fall causes the substrate to be vapor-deposited 2 to be planar.

At the time of alignment between the vapor-deposition mask 1 and the substrate to be vapor-deposited 2 according to the first embodiment, the vapor-deposition apparatus also comprises a micro-motion apparatus which relatively moves the substrate to be vapor-deposited 2 with respect to the vapor-deposition mask 1 while imaging an alignment mark formed on each of the vapor-deposition mask 1 and the substrate to be vapor-deposited 2. Alignment is carried out while stopping supplying power to the electromagnet 3 so that the vapor-deposition mask 1 is not unnecessarily suctioned by the electromagnet 3. Thereafter, the electromagnet 3 being held by a similar holder (not shown) or the touch plate 4 to be lowered to cause current to flow causes the vapor-deposition mask 1 to be suctioned toward the substrate to be vapor-deposited 2.

According to the present embodiment, a structure in which the core portion 151 of the sandwich structure 150 comprising a gap is sandwiched by the end plate 152 is used for the frame 15 of the vapor-deposition mask 1, so that loading or unloading with a robot arm (not shown) can be easily carried out since it is lightweight.

With respect to the electromagnet 3, a plurality of unit electromagnets, in each of which a coil 32 is wound to a core 31, is fixed to a coating material 33 comprising a resin. In the example shown in FIG. 2, with respect to the plurality of unit electromagnets, terminals 32a to 32e of the coil 32 of each unit electromagnet are formed to be connected in series. However, it is construed that the configuration of the electromagnet 3 be not limited to this example, so that it can be made to various configurations. The shape of the core 31 can be a quadrilateral or a circle. For example, when the size of the vapor-deposition mask 1 is approximately G6 (1500 mm×1800 mm), a unit electromagnet comprising the core 31 with the size of the cross section of the unit electromagnet shown in FIG. 1 of approximately 50 mm square can be arranged such that a plurality of unit electromagnets are lined up in accordance with the size of the vapor-deposition mask 1 as shown in FIG. 2 (In FIG. 2, the horizontal direction is reduced in scale and the number of electromagnets is drawn to be less). In the example shown in FIG. 2, the coil 32 is connected in series. However, the coil 32 of each unit electromagnet can be connected in parallel. Moreover, a unit of a few pieces can be connected in series. Current can be independently applied to some of the unit electromagnets.

As shown in the previously-described FIG. 1B, the vapor-deposition mask 1 comprises the resin film 11 and the metal supporting layer 12, and the frame 15 formed in the surrounding thereof and, as shown in FIG. 2, with respect to the vapor-deposition mask 1, the frame 15 is placed on the mask holder 19. A magnetic material is used for the metal supporting layer 12 and/or the frame 15 to cause suction force to act with the core 31 of the electromagnet 3 and cause the substrate to be vapor-deposited 2 to be sucked thereto with the substrate to be vapor-deposited 2 placed between the metal supporting layer 12 and/or the frame 15, and the core 31 of the electromagnet 3.

Various vapor-deposition sources 5 such as point-shaped, linear-shaped, or surface-shaped ones can be used. A linear-shaped vapor-deposition source 5 (extending in a direction perpendicular to the paper surface in FIG. 2) in which crucibles are linearly lined up, for example, is scanned from the left end to the right end of the paper surface to cause vapor-deposition to be carried out on the entire surface of the substrate to be vapor-deposited 2. Therefore, the above-described apertures 11a and 12a are formed in a tapered shape to make even the vapor-deposition material 51 arriving from a slanted direction reach the substrate to be vapor-deposited 2 without blocking it as the vapor-deposition material 51 is flown away from various directions.

(Vapor-deposition Method)

Next, a vapor-deposition method according to a second embodiment of the present invention is described. As shown in FIG. 2 described previously, the vapor-deposition method according to the second embodiment of the present invention comprises arranging a substrate to be vapor-deposited 2 and a vapor-deposition mask 1 shown in FIG. 1B, for example, such that they overlap with each other; and causing a vapor-deposition material to fly away from a vapor-deposition source 5 arranged to be positioned apart from the vapor-deposition mask 1 to cause the vapor-deposition material to be deposited on the substrate to be vapor-deposited 2. In other words, the vapor-deposition method according to the second embodiment of the present invention features that a frame 15 of the vapor-deposition mask 1 is formed by a sandwich structure 150 in which a core portion 151 comprising a gap 151a as in a honeycomb structure and a thin-walled portion 151b is covered by the end plate 152.

Moreover, as described previously, the substrate to be vapor-deposited 2 is overlapped on the vapor-deposition mask 1. Alignment of this substrate to be vapor-deposited 2 and the vapor-deposition mask 1 is carried out as follows: the alignment is carried out by moving the substrate to be vapor-deposited 2 relative to the vapor-deposition mask 1 while observing, with an imaging apparatus, an alignment mark for alignment that is formed on each of the substrate to be vapor-deposited 2 and the vapor-deposition mask 1. In this way, an aperture 11a of the vapor-deposition mask 1 can be made to correspond with a location to be vapor-deposited of the substrate to be vapor-deposited 2 (for example, the pattern of a first electrode 22 of a supporting substrate 21 for a below-described organic-EL display apparatus, for example). The electromagnet 3 is operated after the alignment is carried out. As a result, a strong suction force acts between the electromagnet 3 and the vapor-deposition mask 1, causing the substrate to be vapor-deposited 2 to firmly approach the vapor-deposition mask 1.

Thereafter, as shown in FIG. 2, flying away (vaporization or sublimation) of the vapor-deposition material 51 from the vapor-deposition source 5 to be positioned apart from the vapor-deposition mask 1 causes the vapor-deposition material 51 to be deposited onto the substrate to be vapor-deposited 2. More specifically, while a linear source in which crucibles are formed such that they are lined up linearly can be used, it is construed to be not limited thereto.

According to the present embodiment, the vapor-deposition mask 1 is lightweight, making it very easy to install the vapor-deposition mask 1 into a vacuum chamber. Moreover, the vapor-deposition mask 1 being lightweight makes carrying with a robot arm easy, making it possible to carry out further capsizing of the vapor-deposition mask 1. In other words, mass production is possible, making it possible to achieve a cost reduction. Moreover, the gap 151a of the frame 15 causes heat conduction to be suppressed and also causes the thermal capacity to be reduced, making it possible to suppress the thermal expansion difference between the substrate to be vapor-deposited 2 and the vapor-deposition mask 1 with heat being accumulated in the vapor-deposition mask 1. As a result, this makes it possible to carry out vapor deposition onto a large-sized substrate to be vapor-deposited and also carry out high-definition vapor deposition.

(Method for manufacturing an organic-EL display apparatus)

Next, a method for manufacturing an organic-EL display apparatus using the vapor-deposition method according to the above-described embodiment is described. Methods of manufacturing other than the vapor-deposition method can be carried out with well-known methods, so that a method of depositing an organic layer using the vapor-deposition method of the present invention is mainly described with reference to FIGS. 7A and 7B.

A method for manufacturing an organic-EL display apparatus according to a third embodiment of the present invention comprises: forming a TFT (not shown), a planarizing film, and a first electrode 22 (for example, an anode) on a supporting substrate 21;

overlapping a vapor-deposition mask 1 aligning to the first electrode 22 being oriented downward; and, in vapor-depositing a vapor-deposition material 51, forming a deposition layer 25 of an organic layer using the previously-described vapor-deposition method. In this way, a second electrode 26 (see FIG. 7B; a cathode) is formed on the deposition layer 25.

Figure 7A:
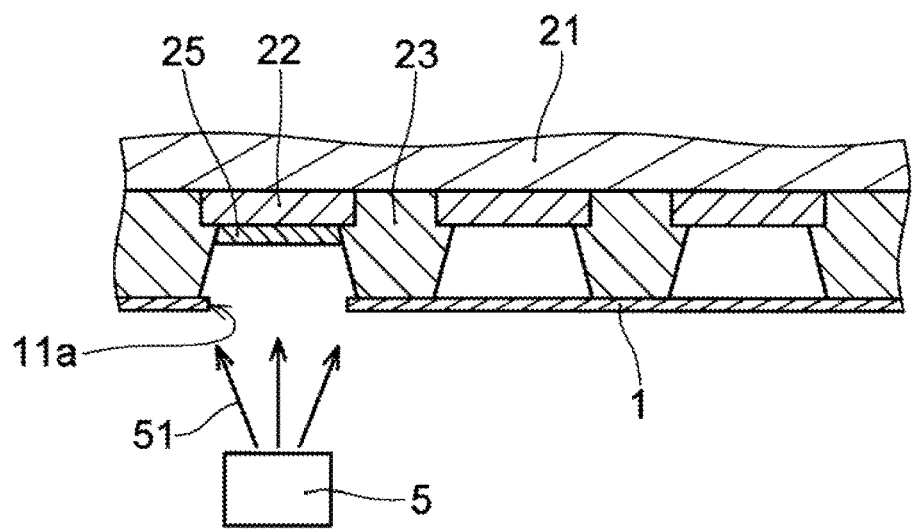
FIG. 7A shows one of vapor-deposition processes in a method for manufacturing an organic-EL display apparatus according to one embodiment of the present invention.
Figure 7B:
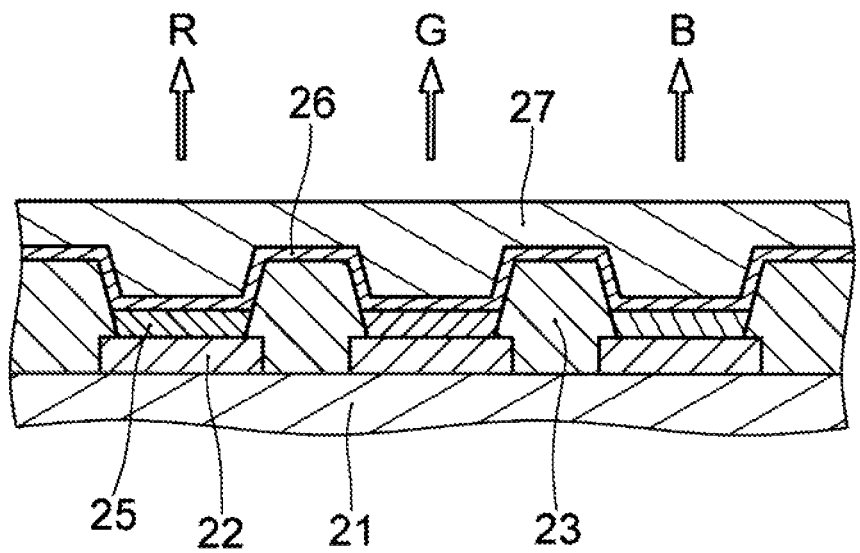
FIG. 7B shows a state in which an organic layer is deposited using the method for manufacturing the organic-EL display apparatus according to one embodiment of the present invention.
Figure 8:
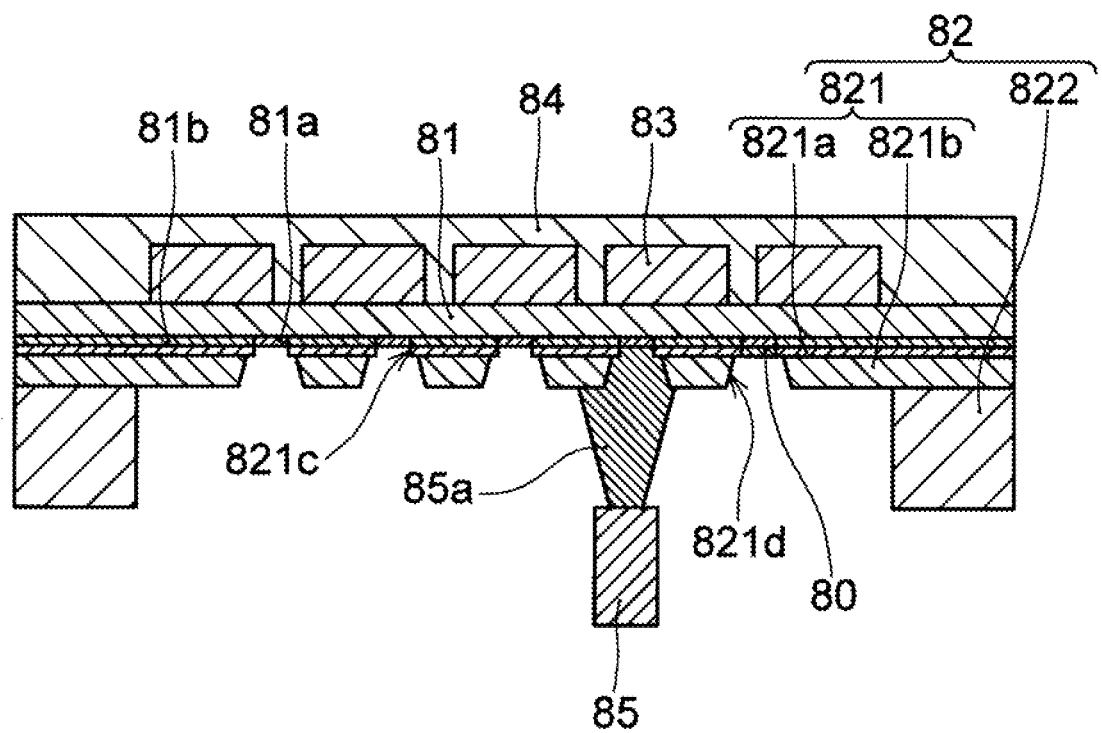
FIG. 8 shows a diagram explaining a conventional case of vapor-depositing an organic layer.

While the supporting substrate 21 such as a glass plate, for example, is not shown fully, a driving element such as a TFT is formed for a RGB sub-pixel of each pixel, and the first electrode 22 that is connected to the above-mentioned driving element is formed on the planarizing layer by a combination of an ITO layer and a layer of metal such as Ag or APC. As shown in FIGS. 7A and 7B, an insulation bank 23 comprising a polyimide resin, an acrylic resin, or $SiO_2$ partitioning sub-pixels is formed in between the sub-pixels. The previously-described vapor-deposition mask 1 is aligned and fixed on the insulation bank 23 of the supporting substrate 21 as such. As shown in FIG. 2 described previously, this fixing is carried out by suctioning using an electromagnet 3 provided via a touch plate 4 on a surface opposite a vapor-deposition surface of the supporting substrate 21 (the substrate to be vapor-deposited 2), for example. As described previously, a magnetic body is used for the metal supporting layer 12 (see FIG. 1B) of the vapor-deposition mask 1, so that, when a magnetic field is provided by the electromagnet 3, the metal supporting layer 12 of the vapor-deposition mask 1 is magnetized to cause a suction force to be produced with the core 31. Even when the electromagnet 3 does not comprise the core 31, the metal supporting layer 12 is suctioned by a magnetic field produced by current flowing through the coil 32.

In this state, as shown in FIG. 7A, the vapor-deposition material 51 flies away from a vapor-deposition source (crucible) 5 within a vacuum chamber, the vapor-deposition material 51 is deposited only on a portion of the supporting substrate 21 that is exposed to an aperture 11a of the vapor-deposition mask 1, and the deposition layer 25 of the organic layer is formed on the first electrode 22 of a desired sub-pixel. This vapor-deposition process can be carried out for each sub-pixel with the supporting substrate 21 being transferred, in order, to a different vacuum chamber. The vapor-deposition mask 1 with which the same material is simultaneously vapor-deposited for a plurality of sub-pixels can be used. When the vapor-deposition mask 1 is to be replaced, a power supply circuit (not shown) is turned off to cause the magnetic field to the metal supporting layer 12 (see FIG. 1B) of the vapor-deposition mask 1 to be removed by the electromagnet 3 (see FIG. 2) not shown in FIG. 7A.

While the deposition layer 25 of the organic layer is simply shown as one layer in FIGS. 7A and 7B, the deposition layer 25 of the organic layer can be formed as a plurality of deposition layers 25 that comprise different materials. A hole injection layer comprising a material having a good matching ionization energy that improves hole injection property can be provided as a layer in contact with the anode 22, for example. A hole-transport layer that allows electron entrapment into a light-emitting layer (energy barrier) as well as improvement in stable transport of holes may be formed on this hole injection layer using an amine material, for example. Moreover, a light-emitting layer which is selected in accordance with a light-emitting wavelength may be formed thereon with an organic fluorescent material of red or green being doped to $Alq_3$ for red or green, for example. Furthermore, as a blue color material, a DSA organic material is used. An electron-transport layer which, together with improving the electron injection property, transports electrons stably is formed on the light-emitting layer using $Alq_3$. Each of these layers that has a thickness of approximately several ten nm (nano-meters) is deposited to form the organic deposition layer 25. An electron injection layer, formed of LiF or Liq, that improves electron injection property can be provided between this organic deposition layer and a metal electrode. In the present embodiment, the organic deposition layer 25 also comprises the above-described layers.

Of the organic deposition layer 25, with respect to the light-emitting layer, an organic layer of a material according to each color of RGB is deposited. Moreover, with respect to the hole-transport layer and the electron-transport layer, it is preferable, with an emphasis on the light-emitting performance, that a material suitable for the light-emitting layer be separately deposited by different materials. However, taking into account the aspect of the cost of materials, the same material common to two or three colors of RGB can be deposited. When the material common to sub-pixels of two or more colors is deposited, the vapor-deposition mask 1 is formed in which the aperture 11a is formed for the common sub-pixels. In a case the vapor-deposition layer differs for individual sub-pixels, one vapor-deposition mask 1 for the R sub-pixel, for example, is used to successively vapor-deposit each organic layer. Moreover, when an organic layer common to RGB is deposited, vapor deposition of an organic layer for each sub-pixel is carried out down to the lower layer of the above-mentioned common layer, and, at the common organic layer, vapor deposition of the organic layer for all pixels is carried out at once using the vapor-deposition mask 1 at which the aperture 11a is formed for RGB. For mass production, with a number of vacuum chambers of a vapor-deposition apparatus being lined up, and a different vapor-deposition mask 1 being installed at each of the number of vacuum chambers, vapor deposition can be carried out continuously by moving the supporting substrate 21 (the substrate to be vapor-deposited 2) through each vapor-deposition apparatus.

After forming of the deposition layer 25 of each organic layer including the electron injection layer such as the LiF layer is completed, as described above, the electromagnet 3 is turned off, so that the electromagnet 3 is separated from the vapor-deposition mask 1. Thereafter, the second electrode (for example, the cathode) 26 is formed on the entire surface. As the example shown in FIG. 7B is for top emission type, a technique in which light is emitted from a surface opposite the supporting substrate 21 in FIG. 7B, the second electrode 26 is formed with a light-transmitting material such as a thin-film Mg—Ag co-crystallized film, for example. Alternatively, Al can be used. For bottom emission type, in which light is emitted via the supporting substrate 21, ITO or $In_3O_4$ is used for the first electrode 22, and a metal having a small work function, for example, Mg, K, Li, or Al, can be used for the second electrode 26. On a surface of this second electrode 26, a protective film 27 comprising $Si_3N_4$, for example, is formed. The entirety is sealed with a sealing layer such as a moisture-resistant resin film or glass (not shown) and is configured such that the deposition layer 25 of the organic layer is prevented from absorbing moisture. Moreover, the organic layer is made common as much as possible and a structure in which a color filter is provided on a surface thereof can be formed.

(Summary)

(1) A vapor-deposition mask according to a first embodiment of the present invention comprises: a mask main body at which an aperture pattern is formed; and a frame to which at least a portion of a peripheral edge of the mask main body is joined to hold the mask main body at a certain state, wherein the frame is formed as a sandwich structure in which an end plate is bonded onto an opposing surface of at least a part of a columnar-shaped core portion having a gap.

The vapor-deposition mask according to one embodiment of the present invention decreases the weight thereof substantially. As a result, this makes conveyance using a robot arm easier and being able to substantially upsize to approximately G8 or more, although the upper limit of approximately G6H for the size of a substrate to be vapor-deposited that is presently used in a manufacturing line of an organic-EL display apparatus. Moreover, heat conductance of the frame is substantially suppressed by the gap, causing heat conductance to the substrate to be vapor-deposited to be suppressed, making it possible to carry out a more highly-defined organic material vapor-deposition. Furthermore, a reduction in thermal capacity makes it possible to also eliminate heat accumulation.

(2) The frame being formed with a metal material and a gap of the core portion being formed in a broadly-defined honeycomb structure make it possible to obtain the rigidity that can even tolerate load in the horizontal direction that is applied on the core portion at which the gap is formed.)

(3) The mask main body being a hybrid mask in which a resin film on which the aperture pattern is formed is bonded to a metal supporting layer comprising an aperture formed so as to not close the aperture pattern of the resin film is preferable since the pattern of the resin film stabilizes and magnetic attraction force is strong.

(4) In a case that the mask main body is a metal mask comprising a thin metal plate on which the aperture pattern is formed, further tension is applied thereto compared to the tension applied to the hybrid mask, contributing to improvement in the strength of the frame.

(5) The frame having a frame-like rectangular shape and the gap being formed such that it faces the outside of the frame from the inside surrounded by the frame at a side of the frame to which the resin film is joined is preferable because this structure makes it possible to obtain the rigidity that is sufficient against tension even when the mask main body is bonded to the side of the frame with tension being applied.

(6) It is preferable that, with respect to the joining of a peripheral edge of the main mask body to the frame, a portion of the peripheral edge of the main mask body be bent to be joined to an outer peripheral side wall opposite to the inside of the frame. This makes it easier to obtain a sufficient rigidity even against tension of the mask main body.

(7) An end plate formed with a magnetic metal plate being bonded to the entire outer peripheral wall of the frame enclosing the gap, can cause the rigidity against stress to be high, and can prevent a vapor-deposition material such as an organic material from seeping into the gap or a cleaning agent at the time of cleaning from remaining in the gap. Moreover, the magnetic metal plate can be used to make it easier to allow suctioning with a magnet.

(8) The gap surrounded by the end plate being depressurized is preferable since a gas entering into the gap is prevented from flowing out even when the end plate is used within the vacuum chamber.

(9) A rare gas being filled inside the gap surrounded by the end plate is preferable since heat conductance is suppressed.

(10) Moreover, a method of vapor deposition according to a second embodiment of the present invention comprises: arranging a substrate to be vapor-deposited and the vapor-deposition mask as described in one of (1) to (9) such that they overlap each other; and depositing the vapor-deposited material onto the substrate to be vapor-deposited by causing a vapor-deposited material to fly away from a vapor-deposition source arranged at a distance from the vapor-deposition mask.

The vapor-deposition method according to the second embodiment of the present invention makes it easier to handle the vapor-deposition mask with a robot arm since the vapor-deposition mask is made very lightweight, and a further upsizing of the substrate is realized.

(11) The frame of the vapor-deposition mask having a frame-like rectangular shape and the substrate to be vapor-deposited and the vapor-deposition mask being arranged such that a side of the frame formed such that the gap faces the outside of the frame from the inside surrounded by the frame is positioned upward and downward causes a sufficient rigidity to be obtained even against the self-weight of the vapor-deposition mask.

(12) Furthermore, a method for manufacturing an organic-EL display apparatus according to a third embodiment of the present invention comprises: forming at least a TFT and a first electrode on a supporting substrate; vapor-depositing an organic material on the supporting substrate using the method of vapor deposition that is described in

(10) or (11) in the above to form an organic deposition layer; and forming a second electrode on the organic deposition layer.

The method for manufacturing the organic-EL display apparatus according to the third embodiment of the present invention makes easier to install a vapor-deposition mask when the organic-EL display apparatus is manufactured and causes an uneven thermal expansion of the vapor-deposition mask and the substrate to be vapor-deposited to be suppressed, making it possible to suppress misalignment between the substrate to be vapor-deposited and the vapor-deposition mask and to obtain a display panel with a high-definition pattern.

DESCRIPTION OF REFERENCE NUMERALS

1 Vapor-deposition mask
2 Substrate to be vapor deposited
3 Electromagnet
5 Vapor-deposition source
10 Mask main body
11 Resin film
11a Aperture
12 Metal supporting layer
12a Aperture
15 Frame
15a Vertical frame
15b Horizontal frame
150 Sandwich structure
151 Core portion
151a Gap (through hole)
151b Thin-walled portion
152 End plate
17 Plate-shaped body
18 Adhesive layer
19 Mask holder
21 Supporting substrate
22 First electrode
23 Insulation bank
25 Deposition layer
26 Second electrode
29 Substrate holder

The invention claimed is:

1. A vapor-deposition mask comprising:
a mask main body at which an aperture pattern is formed; and
a frame to which at least a portion of a peripheral edge of the mask main body is bonded with tension applied to hold the mask main body at a certain state, the frame being formed of a columnar-shaped body having a thickness larger than a thickness of the mask main body,
wherein the frame is formed as a sandwich structure in which at least an end plate is bonded onto opposing surfaces of at least a part of a columnar-shaped core portion having a gap;
wherein a peripheral end plate formed with a magnetic metal plate is bonded to an entire outer peripheral wall of the frame having the gap; and
wherein a rare gas is filled inside the gap surrounded by the peripheral end plate.

2. The vapor-deposition mask according to claim 1, wherein the frame is formed with a metal material and the gap of the columnar-shaped core portion is formed in a broadly-defined honeycomb structure.

3. The vapor-deposition mask according to claim 1, wherein the mask main body is a hybrid mask in which a resin film on which the aperture pattern is formed is bonded to a metal supporting layer comprising an aperture formed so as to not close the aperture pattern of the resin film.

4. The vapor-deposition mask according to claim 1, wherein the mask main body is a metal mask comprising a thin metal plate on which the aperture pattern is formed.

5. The vapor-deposition mask according to claim 1, wherein the frame has a frame-like rectangular shape and the gap is formed such that it faces an outside of the frame from an inside surrounded by the frame at a side of the frame to which the mask main body is joined.

6. The vapor-deposition mask according to claim 1, wherein, with respect to the joining of a peripheral edge of the mask main body to the frame, a portion of the peripheral edge of the mask main body is bent to be joined to an outer peripheral side wall opposite to an inside of the frame.

7. A method of vapor deposition, the method comprising:
arranging a substrate to be vapor-deposited and the vapor-deposition mask according to claim 1 such that they overlap each other; and
depositing a vapor-deposited material onto the substrate to be vapor-deposited by causing the vapor-deposited material to fly away from a vapor-deposition source arranged at a distance from the vapor-deposition mask.

8. The method of vapor deposition according to claim 7, wherein a frame of the vapor-deposition mask has a frame-like rectangular shape and the frame is positioned in an upright position such that the frame intersects a horizontal plane, and the gap of an upper side or a lower side in the frame faces an outside of the frame from an inside surrounded by the frame.

9. A method for manufacturing an organic-EL display apparatus, the method comprising:
forming at least a TFT and a first electrode on a supporting substrate;
vapor-depositing an organic material on the supporting substrate using the method of vapor deposition according to claim 7 to form an organic deposition layer; and
forming a second electrode on the organic deposition layer.

10. The vapor-deposition mask according to claim 1, wherein the gap of the columnar-shaped core portion is formed in a broadly-defined honeycomb structure.

* * * * *